United States Patent [19] [11] 4,223,300
Wiklund [45] Sep. 16, 1980

[54] ELECTRO MECHANICAL POSITION INDICATOR USING RELATIVELY MOVEABLE COILS

[75] Inventor: Klas R. Wiklund, Sandbrovägen, Sweden

[73] Assignee: AGA Aktiebolag, Lidingo, Sweden

[21] Appl. No.: 878,373

[22] Filed: Feb. 16, 1978

[30] Foreign Application Priority Data

Feb. 16, 1977 [SE] Sweden ................................ 7701675

[51] Int. Cl.$^2$ ......................... G08C 9/00; G01R 33/00
[52] U.S. Cl. .................................... 340/196; 340/199; 324/208; 336/121; 318/661
[58] Field of Search ...................... 340/195, 196, 199; 336/129, 123, 122, 115, 119, 120; 324/207, 208; 318/659, 660, 661

[56] References Cited

U.S. PATENT DOCUMENTS

| 2,650,352 | 8/1953 | Childs | 340/196 |
|---|---|---|---|
| 2,799,835 | 7/1957 | Tripp et al. | 340/195 |
| 2,900,612 | 8/1959 | Tripp | 336/123 |
| 2,921,280 | 1/1960 | Litwin et al. | 336/120 |
| 3,441,888 | 4/1969 | Farrand | 340/196 |
| 3,641,429 | 2/1972 | Cox et al. | 324/208 |
| 3,705,400 | 12/1972 | Cordes, Jr. | 318/632 |
| 4,070,665 | 1/1978 | Glennon et al. | 318/661 |

Primary Examiner—Rudolph V. Rolinec
Assistant Examiner—Walter E. Snow
Attorney, Agent, or Firm—Larson, Taylor and Hinds

[57] ABSTRACT

An electromechanical positioner indicator is provided which comprises first and second relatively movable parts, the first part including two oppositely facing surfaces which are everywhere equidistant and the second part including two surfaces which are everywhere equidistant and which are everywhere equispaced from and lie, closely adjacent to respective ones of the two surfaces of the first part. A first coil, preferably in printed circuit form, is secured to the first part and sensing coils, also preferably in printed circuit form, are secured to each of the two surfaces of the second part. The inductive coupling between the coils is dependent on the relative positions of the parts and thus the output of the sensing coils provides an indication of position. In one embodiment, the surfaces in question are formed by cylinders and in another, the first part is a disc and the main coil comprises an annulus. Particular coil and coil conductor shapes are also disclosed.

28 Claims, 16 Drawing Figures

ELECTRO MECHANICAL POSITION INDICATOR USING RELATIVELY MOVEABLE COILS

CROSS REFERENCE TO RELATED APPLICATIONS

This application contains subject matter in common with my currently filed, commonly assigned copending application Ser. No. 878,375, entitled HIGH ACCURACY MEASURING APPARATUS and now abandoned, and the latter application is hereby incorporated by reference.

FIELD OF THE INVENTION

The present invention relates to an improved electro-mechanical position indicator.

BACKGROUND OF THE INVENTION

In a known form of electro-mechanical position indicator, two parts are movable relative to one another in a predetermined direction. One part is provided with a primary winding so arranged that with an alternating current supplied thereto, an alternating magnetic flux is generated substantially normal to the direction of movement referred to, this magnetic flux varying in a predetermined manner at least in this direction. The other part of the position indicator is provided with at least two sensing windings mutually offset in the aforesaid direction. These sensing windings each sense the magnetic flux in proximity thereto.

Rotary devices of the type described in the preceeding paragraph are particularly useful in measuring angles. One form of such a device is a conventional resolver, which characteristically includes two sensing windings disposed relative to one another at an angle of 90°. A further such device is a conventional synchro, which characteristically includes three windings that are mutually displaced by 120°. Resolvers and synchros are normally used for transmitting data representing angles from a transmitting device to a receiving device and continuous or continual angular transmission can be provided. Other forms of resolvers and synchros can be used as angle-measuring devices, particularly where an accuracy is desired which is greater than that provided by resolvers and synchros which are now commercially available. Such angle-measuring devices could be used to measure angles with the degree of accuracy required, for example, for theodolites or gun-sights, etc. In such applications, a device is normally used in which an accurately prepared measuring pattern is placed on, for example, sheets of glass or some other stable material and read off optically or electronically. In order to eliminate the effect of parallax, for example, a reading has been made at two or more positions. The number of positions such readings require increases with the number of parts of the pattern read off, thus lowering the accuracy requirements of an individual marking of the measuring pattern.

Since angle-measuring devices of the aforementioned optical type must be manufactured with a very high degree of accuracy, the devices are extremely expensive. Such devices are also very fragile.

In the case of a conventional electro-mechanical resolver or synchro, the whole of the mutually movable surfaces are used for the detection of an angle, since the magnetic field which transfers the angular information between stator and rotor often varies in the manner of a sine or cosine fuction over the surface in question. The stability of such a component can therefore be less with respect to each individual "electrical loop" of the emitter winding since the output signal of the angle indicator (resolver or synchro) constitutes the mean value of the position of a large number of loops. If the individual loops could be fixed in a stable, accurate manner, a resolver or a synchro would be an extremely accurate angle-indicator. There is a further problem, however, with the use of a conventional electro-mechanical resolver or synchro as an angle measuring device. This problem results from the fact that such an electromechanical device includes a multiplicity of lamellae which are joined together with other elements. This makes it difficult to thermally match the elements incorporated in the device, so that changes in temperature will affect the output signal. The effect of temperature variations can cause measuring variations of the order of magnitude of several minutes of arc.

SUMMARY OF THE INVENTION

According to the invention, an electro-mechanical position indicator apparatus is provided which comprises first and second parts, the first part having two oppositely facing parallel surfaces and the second part having two parallel surfaces each of which extends parallel to and closely adjacent a respective one of the surfaces of the first part. At least one of the aforementioned surfaces of the first part has secured thereto a primary or main coil while the aforementioned surfaces of the second part each have secured thereto at least one secondary or further coil. The two parts are mounted for relative movement to cause the further coils to translate along a predetermined path relative to the primary coil, and the inductive coupling between each said secondary coil and said primary coil is dependent on the relative position of said parts. Before proceeding it should be noted that the term "parallel" as used here and in the claims is intended to encompass both flat surfaces and concentric cylindrical surfaces and thus is apparently broader than the accepted definition of the term as used in geometry. Stated somewhat differently, the term parallel surfaces as used in this application is intended to cover surfaces which are everywhere equidistant, whether flat or cylindrical.

In one embodiment of the invention, each of the surfaces referred to above is substantially flat and the individual turns of each said coil occupy a respective single plane parallel to said surfaces. In a further embodiment, these surfaces are concentric cylindrical surfaces.

Preferably, the individual turns of each further coil are uniformly mutually spaced. Further, parts are preferably mutually positioned such that when the primary coil is energized, the magnetic flux density is the same at each surface carrying a said further coil. Preferably, each said coil is constituted by an electrically conductive pattern formed by a conductive layer secured to the relevant surface. Each layer is preferably a printed circuit.

In a further embodiment of the invention, one of said parts is generally plate-like and the parts are mutually rotatable about an axis. In this embodiment, the primary coil is generally annular and is centered on the axis of rotation.

Preferably, each of the coils has the form of at least one rectangular spiral having two opposite parallel sides which are also parallel to the predetermined path referred to above. Further, those conductors of the (or each) spiral of said primary coil which extend transversely of the path are inclined at an acute angle relative to the corresponding conductors of each secondary coil, the transverse conductors of each secondary coil, or of said secondary coil, being substantially perpendicular to the path, and the acute angle being such that the distance, in the direction of the path, between the ends of each of the transverse conductors of the primary coil, or of each secondary coil, is greater than the conductor spacing of the transverse conductors in the other coil or coils.

Preferably, the shortest conductor of each secondary coil which extends transversely of the predetermined path is longer than the longest conductor in said primary coil extending transversely of the path.

The primary coil preferably has a cylically repeated winding pattern. Further, each secondary coil advantageously comprises a plurality of partial coils (coil parts), the secondary coils are substantially identical, and each part coil is wound in the same manner as the secondary coil at least over one half cycle thereof.

In a further embodiment, each part coil is wound in the same manner as the primary coil over a whole cycle thereof.

In yet another embodiment, the first and second parts are mounted for mutual rotation and there are provided two additional coils corresponding to the secondary coils which are mutually offset by 90°. A resolver may be constructed in this manner.

In a further embodiment, the first and second parts are mounted for mutual rotation and there are provided three coils, corresponding to the secondary coils referred to above, which are mutually offset by 120°. In this manner, a synchro may be constructed.

In a preferred measuring system, an electronic processing unit is connected to the terminals of the secondary coils. The electronic processing unit provides an output representing the relative position of the parts and includes an electronic storage unit having a plurality of storage locations individually addressable in response to addressing signals which are dependent on an alternating voltage supplied to the primary coil and which are supplied to an address input of the storage unit. The storage unit stores correction values corresponding respectively to angular or linear values of position in or along the predetermined path and supplies correction signals representing these correction values. A correction unit is connected to receive the correction signals so as to correct said measured values in accordance with the correction values and is arranged to provide an output representing each measured value thus corrected. The storage means preferably comprises a nonvolatile memory and conventionally comprises a read-only memory.

Other features and advantages of the invention will be set forth in, or apparent from, the detailed description of the preferred embodiments found hereinbelow.

BRIEF DESCRIPTION OF THE DRAWINGS

To provide a better understanding of the invention, and to show how the same may be carried into effect, reference will now be made, by way of example, to the accompanying drawings, in which:

FIG. 1b is a sectional view of an embodiment suitable for using the winding pattern illustrated in FIG. 1a;

FIG. 2 illustrates a resolver having a winding pattern of the type shown in FIG. 1a;

DESCRIPTION OF THE PREFERRED EMBODIMENTS

Figure 1A:
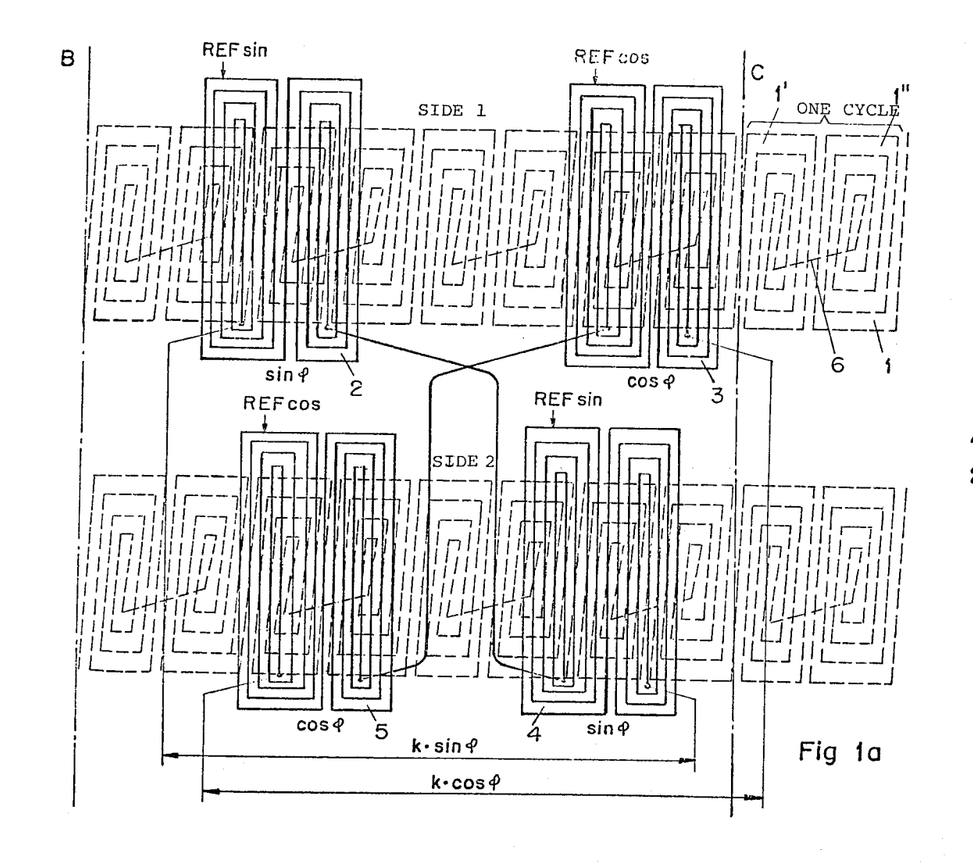
FIG. 1a illustrates a winding pattern.

Referring to the drawings, wherein similar elements are referenced in the respective figures by the same numerals and/or letters, and, in particular, to FIG. 1a, a schematic diagram is provided of a first embodiment of winding pattern for a measuring instrument. In the upper and lower parts of FIG. 1a the same winding 1 is viewed from the same direction. As illustrated, winding 1 has a cyclically repeated pattern formed by rectangular spirals, extending horizontally and producing a magnetic flux whose strength perpendicular to the plane of the winding varies along the lingitudinal direction thereof. At the far right of the FIG. 1a, at the top thereof, one "cycle" of the winding pattern is indicated by a bracket and, as illustrated, comprises rectangular coils 1' and 1" and a connecting conductor 6. Winding 1 is supplied with a sinusoidal alternating current and will hereinafter be referred to as the primary winding. In the upper half of FIG. 1a are illustrated two sensing windings 2 and 3 which are movable along one side (side 1) of the primary winding 1, and in the lower half of FIG. 1a are shown two further sensing windings 4 and 5 which are movable along the other side (side 2) of winding 1. For the sake of clarity, winding 1 is illustrated in dash lines, but it will, of course, be understood that in reality the winding consists of unbroken conductors.

Figure 1B:
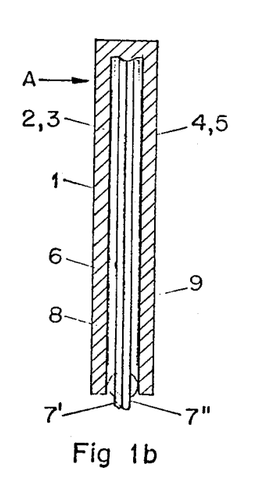
Figures 5A, 5B:
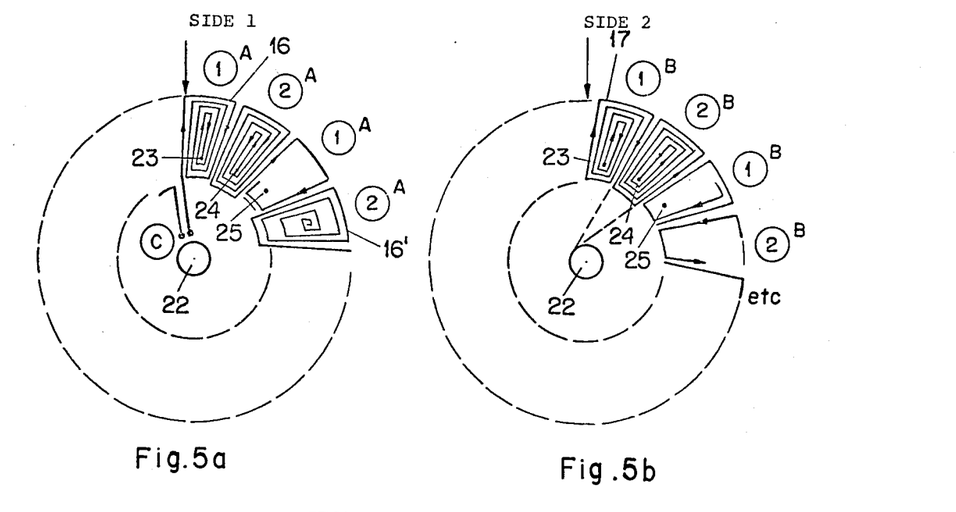
FIGS. 5a, 5b, 5c and 5d illustrates windings of the embodiment illustrated in FIG. 4.

FIG. 1b illustrates a section through a device having winding 1 incorporated therein. The arrow A in FIG. 1b shows the general direction from which the windings of FIG. 1a are viewed in that figure. In FIG. 1b, winding 1 is arranged in a secure stable manner on a rigid plate or substrate 7' such as by forming the winding pattern with printed conductors. Each "cycle" of winding 1 comprises two spirally-wound sections (corresponding to 1' and 1") which are so wound that the magnetic fields generated by the sections will be directed in respectively opposite directions. These sections of each cycle are mutually connected by a conductor 6 disposed on the other side of the plate 7' from the winding pattern. On the side of the plate 7' which carries the winding 1, a further plate 7" is arranged for stiffening and spacing purposes. It is noted that a further embodiment of primary winding will be described hereinafter with reference to FIGS. 5a and 5b. The primary winding illustrated in FIGS. 5a and 5b is to be preferred over the primary winding of FIG. 1 since it utilizes the plate 7' and plate 7" more advantageously.

On the external sides of plates 7' and 7" are respectively arranged two further opposing plates 8 and 9 which extend parallel to the plates 7' and 7". Sensing windings 2 and 3 are arranged on the side of plate 8 facing plate 7' and sensing windings 4 and 5 are arranged on the side of the plate 9 facing plate 7''. Further, plate 7' is provided with the conductors 6 on the side thereof facing plate 8.

As will be seen from FIG. 1a, the sensing windings 2 to 5 each comprise two winding portions which are oppositely wound, i.e., wound in opposite senses, and which are wound in the form of rectangular spirals, as with the primary winding 1. The portions of each sensing winding are arranged with mutually opposite winding directions and are so spaced that, between them, the sensing windings overlie and cover one complete cycle of said primary winding 1. Each of sensing windings 2 to 5 on each side of the primary winding (i.e., above and beneath the plane of the primary winding 1 in the showing in FIG. 1a) is so extended that each turn of each sensing winding extends laterally beyond primary or emitter winding 1, i.e., on either side of the longitudinal edges.

As will be understood by those skilled in the art, sensing windings 2 and 4 constitute a pair of "sine"-windings and sensing windings 3 and 5 constitute a pair of "cosine"-windings. The windings of the sine-winding pair 2 and 4 and the windings of the cosine-winding pair 3 and 5 are connected together in series. The sensing windings 2 and 3, and sensing windings 4 and 5, are so mutually displaced that the magnetic flux sensed by one pair of sensing windings (windings 2 and 4) is displaced 90° (i.e., ¼ pole division) in relation to the magnetic flux sensed by the other pair (windings 3 and 5) so that one winding pair approximately indicates the sine value and the other the cosine value of the angular position (i.e., the position within a cycle) of the respective pair of sensing windings. Thus, for a reference position with positive angle 0, the sine-winding (windings 2 and 4) provides a 0-signal and the cosine-winding pair (windings 3 and 5) produces a maximum signal.

In order that the output signal from the sensing windings varies as uniformly as possible, the turns of the primary windings are inclined so that the individual conductors of the winding, which extend transversely to the direction of movement, have an approximate inclination such that their end to end displacement in the direction of movement is at least the same distance as that between two adjacent conductors in the direction of movement. The output signal from each of the series-coupled winding pairs 2, 4 and 3,5, respectively, is produced between the ends thereof in each case. Winding 1 is supplied with a sinusoidal alternating current and the voltage induced in each sensing winding is dependent upon the number of turns in which current is induced by the magnetic field from the primary winding 1. The voltage across the sensing winding is, of course, an alternating current voltage. The effective value, the maximum value or mean value can be sensed and utilized as an indication of angular position.

Owing to the fact that windings 2 and 4 and windings 3 and 5, respectively, are symmetrical and disposed on respective sides of the winding 1, compensation is introduced for possible relative movement transversely of the plane of the drawing. By making the shortest transverse conductor path of each sensing winding longer than the extent of the longest ocnductor path of the primary winding 1 in the transverse direction, the influence of errors in the transverse setting between the units 7,8 and 9 is reduced. In the embodiment of FIGS. 1 and 1b, it has been assumed that the winding 1 is part of a stationary unit and the windings 2 to 5 are part of a movable unit. Conveniently, all the windings are formed as printed circuit conductors as provided for hereinabove.

Figure 2:
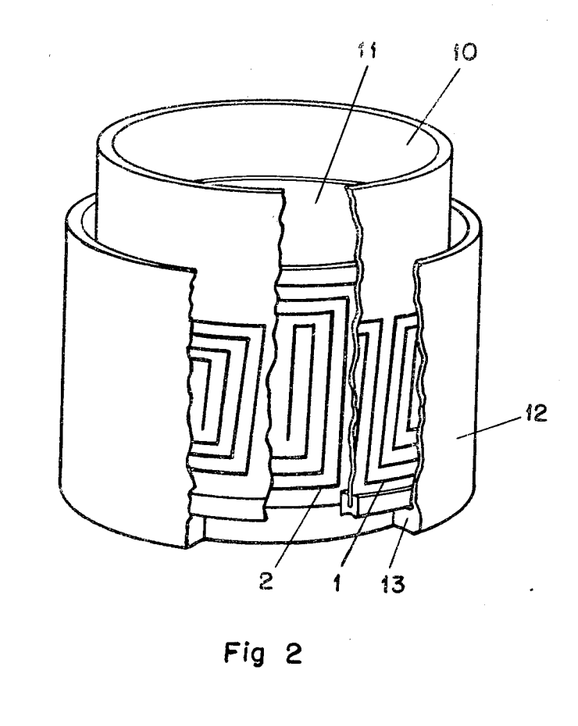

When the position indicator according to the invention is to be used as an angle-measuring device, the winding pattern illustrated in FIG. 1 can be arranged on three cylinders in the manner shown in FIG. 2. In this respect, the windings can either be formed so that the pattern between the portion B and C shown in chain lines in FIG. 1a forms the whole cylindrical winding or, depending upon the desired number of poles, the pattern between B and C can be repeated a required number of times about the circumferential surface of the cylinder. In FIG. 2, the winding 1 is arranged on the outer surface of the cylinder 10 with the cross conductors, corresponding to conductor 6 of FIGS. 1a and 1b, being disposed on the inside of the cylinder 10. It will be understood that the cylinder 10 may, alternately be provided with a primary winding of the type described hereinafter with reference to FIG. 5a and FIG. 5b, with winding parts on both the inside and the outside of the cylinder 10. Sensing windings 2 and 3 are arranged on the outer surface of a further cylinder 11 disposed radially inwardly of the cylinder 10 while sensing windings 4 and 5 are arranged on the inner surface of the cylinder 12 disposed radially outwardly of the cylinder 10. As will be seen from FIG. 2, the cylinders 11 and 12 are connected together by means of a cross wall 13. With this arrangement, either the cylinder 10 can be made the rotor and the parts 11 to 13 the stator, or vice versa.

Figure 3:
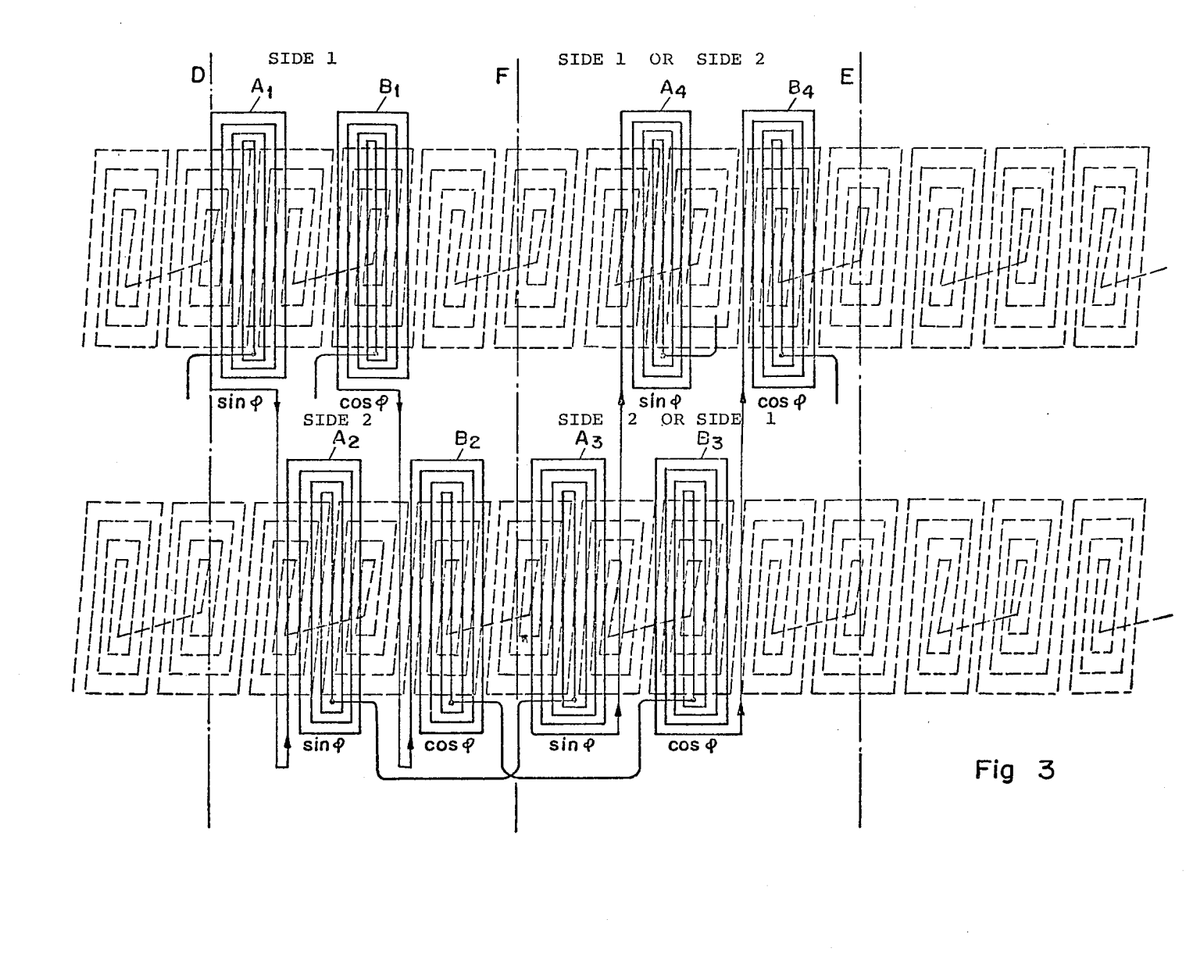
FIG. 3 illustrates a second embodiment of a winding pattern similar to that of FIG. 1.

FIG. 3 illustrates a further embodiment of wherein "sine" and "cosine" windings are disposed on either side of a primary winding 1. As will be apparent when making a comparison between FIG. 1 and FIG. 3, all the sensing windings in FIG. 3 have been divided into two separate windings at that location where the winding direction changes and have been divided between side 1 and side 2 of primary winding 1. More specifically, the winding 2 has been divided to form a winding $A_1$ mounted on side 1 and a winding $A_2$ on side 2. The winding 3 has been divided into a winding $B_1$ mounted on side 1 and a winding $B_2$ mounted on the side 2. The winding 4 can also be divided into a winding $A_3$, which may either be mounted on side 1 or side 2, and a winding $A_4$ which is mounted on the opposite side from winding $A_3$. Winding 5 is divided to form a winding $B_3$ disposed on the same side as winding $A_3$ and a winding $B_4$ disposed on the same side as the winding $A_4$. Similarly to the FIG. 1 embodiment, the winding pattern between section D and E shown in chain lines can be repeated and may be arranged in the manner shown in FIG. 2. The embodiment of FIG. 2 may also be utilized as a resolver, preferably employing cast copper coils which are iron-free.

Figure 4:
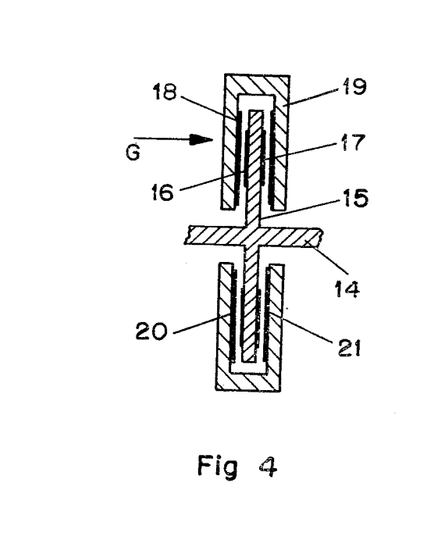
FIG. 4 is a sectional view of a further type of resolver.

When the FIG. 2 embodiment is utilized as a resolver, certain problems may arise when assembling the device, since the parts 10 to 13 must be accurately positioned relative to one another, particularly in the radial direction. Moreover, this arrangement requires a relatively large amount of space. To overcome these problems, a further embodiment has been devised in which the windings are arranged annularly in mutually parallel planes around circular plates having a common center. Either that part which carries the primary winding or that part which carries the sensing windings is made to be rotatable about the center. FIG. 4 is a sectional view of this embodiment. In the embodiment of FIG. 4, primary windings 16 and 17 are mounted on a circular plate 15 which acts as a rotor and which is provided with a shaft 14 with which plate 15 rotates. A further pair of circular plates 18 and 19 are symmetrically and fixedly mounted around plate 15 in parallel relation thereto. Plates 18 and 19 are joined together by a common cross wall, as illustrated. The plates 18 and 19 carry sensing windings 20 and 21. It will, of course, be understood that this embodiment can be modified in a manner such that the rotor carries the sensing windings and the primary winding is arranged on the stator on each side of the sensing windings.

FIGS. 5a to 5d illustrate the various windings on the stator and rotor as seen in the direction of arrow G in FIG. 4. Similarly to the winding 1 in FIGS. 1 and 3, primary windings 16 and 17 of this embodiment are also obliquely disposed so that the conductors extending transversely of the direction in which the winding arrangement extends do not run radially, but rather run inwardly to form tangents with a circle 22 having a radius R. This is seen best in FIG. 5b, where extensions of the conductors towards the periphery of the circle 22 have been shown in dash lines. The radius R is selected to give a smooth output characteristic.

As noted above, the embodiment of the primary winding shown in FIGS. 5a and 5b is generally to be preferred over the primary winding shown in FIGS. 1 and 3. As opposed to the primary winding 1 of FIG. 1 and 3, which is arranged solely in one plane, the winding of the embodiment of FIGS. 5a and 5b is arranged on both sides of the rotor with lead-throughs between the sides being provided at 23, 24, 25 and so on, as illustrated. The windings on opposite sides A and B of the plate 15 are so wound as to provide co-acting magnetic fields. This means that the winding directions are different for spirals lying opposite each other on respective sides of the associated rotor when viewed from the same direction. The winding on side B is displaced a half conductor distance laterally to the left in FIGS. 5a and 5b in relation to the winding on side A, so that each conductor in the winding on side B will lie mid-way between two conductors in the winding on side A. It should be noted that the winding 1 in FIGS. 2 and 3 can conveniently be replaced by a winding of the type corresponding to windings 16 and 17, which winding would then be arranged on both sides of the plate 15.

Figure 5C:
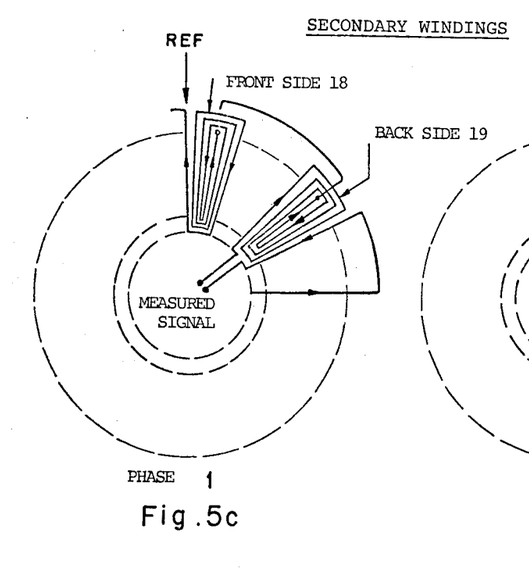
Figure 5D:
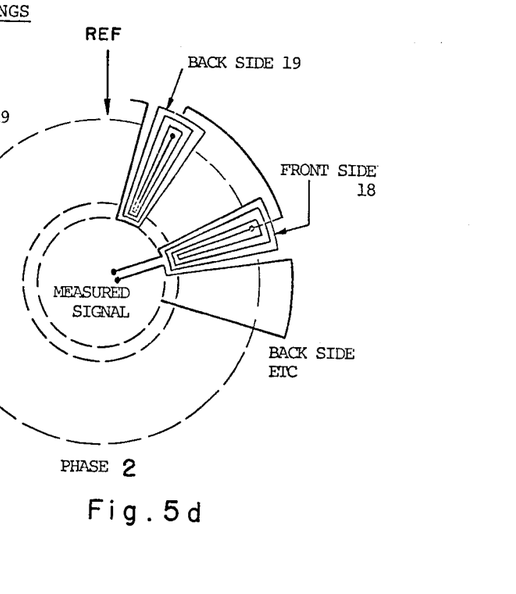

FIG. 5c illustrates a "cosine" sensing winding while FIG. 5d illustrates a "sine" sensing winding. FIGS. 5c and 5d also illustrate a further embodiment of the positioning of these windings relative to the pattern of the primary winding. Windings in this embodiment are so arranged that each winding part of each sensing winding is arranged across a half-pole division of the primary winding and arranged on each side of the stator for every second primary winding pole division. As will be seen from FIGS. 5c and 5d, the directions in which the windings are wound are different on respective sides of the stator (as viewed from the same direction). As will also be seen from FIG. 5c and FIG. 5d, the conductors of the sensing windings extending transversely to the direction of movement are also substantially radial. The specific embodiment shown in FIG. 5 has 8/16 poles and thus produces a succinct output signal within ⅛ revolution.

FIG. 5a illustrates, at 16′, the manner in which a primary winding can be designed so that the magnetic field sensed by a sensing winding in different positions is more nearly proportional to the sine and cosine for the angular position relative to the primary winding. As will be seen from FIG. 5a, the transversely extending conductors of winding 16′ are shorter the more centrally they are located in the spiral. The conductors forming winding 16′ are also inclined differently, i.e., their extensions need not extend towards the periphery of the circle 22. As a result of this winding construction, there is obtained a greater inclination at zero throughput and a smoothing at the maximum transition of the field detected by the sensing windings. As illustrated, the innermost conductors are very short compared with the outermost conductors.

Further in this regard, in order to reduce the effect of errors in the axis orientation relative to the center of the stator, the extent of the shortest conductors of the stator in the transverse direction has been made longer than the longest conductors of the rotor so that a total overlapping is obtained. The whole of the arrangement is such that compenstion is obtained for temperature variations and radial play. Furthermore, the arrangement is able to be readily reproduced. The two stator units have been displaced through one pole division so as to provide compensation for possible irregularities in the field generated by the rotor winding.

Figure 6:
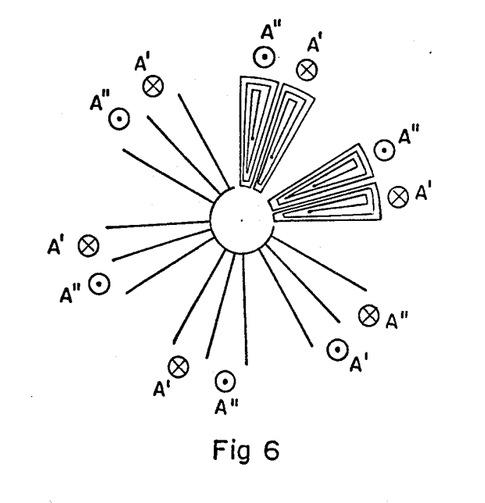
FIG. 6 illustrates a further embodiment of a winding.

Referring to FIG. 6, there is shown a further embodiment of an arrangement of one sensing winding for a 24/12 pole resolver. In this embodiment, the sensing winding, which is the winding illustrated, is arranged in a manner similar to that illustrated in FIG. 3, with the difference being that the sides between the dash-dot lines F and E in FIG. 3 have changed positions in FIG. 6.

Figure 7:
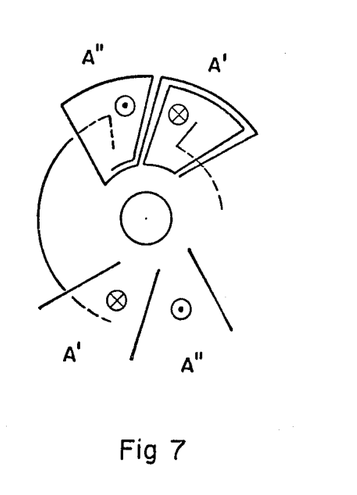
FIGS. 7 to 9 illustrate a further embodiment of apparatus of the type shown in FIGS. 1a and 1b.
Figure 8:
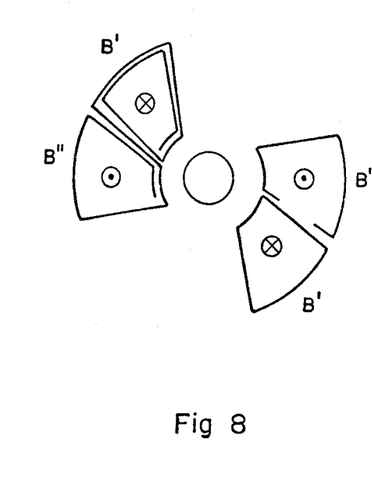
Figure 9:
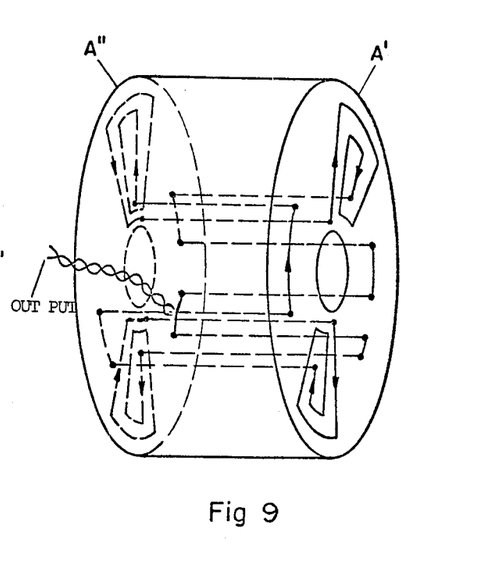

FIGS. 7 to 9 illustrate a further embodiment of a flat resolver in which the sensing windings are obliquely disposed and arranged on a common center member of cylindrical form as shown in FIG. 9. The illustrated resolver is 8/4 pole device. The primary winding is not shown in FIGS. 7 to 9, but comprises windings arranged on both sides of the central member, the windings cooperating with each other and each being of the type illustrated in FIGS. 1 and 3. However, in this embodiment, the primary winding comprises radially extending transverse conductors.

The "sine" windings are illustrated in FIG. 7 wherein A′ indicates the arrangement on one side of the center portion and A″ indicates the arrangement on the other side of the center portion.

FIG. 8 illustrates the "cosine" winding, with winding portion B′ being disposed on one side and winding portion B″ on the other.

FIG. 9 is a perspective view of the center portion illustrating the "sine" winding A′,A″, the "cosine" winding B′, B″ of FIG. 8 having been omitted for the sake of clarity. FIG. 9 clearly shows the positioning of the winding and the requisite leadthrough. For the sake of clarity, the center portion in FIG. 9 has been made much thicker than in reality.

In a further embodiment, the primary winding has obliquely positioned, i.e. non-radial transversely extending conductors. This embodiment differs from the previous embodiments in that the conductors on each side of the center point of each winding half have a different angle of inclination.

In yet another embodiment of the primary or emitter winding, one half-pole division, is of the same design as that discussed in the preceeding paragraph the other half-pole divisions of the conductor, are inclined in the opposite direction to, i.e., are slanted relative to the corresponding conductors of the first pole-half dimension.

Figure 10:
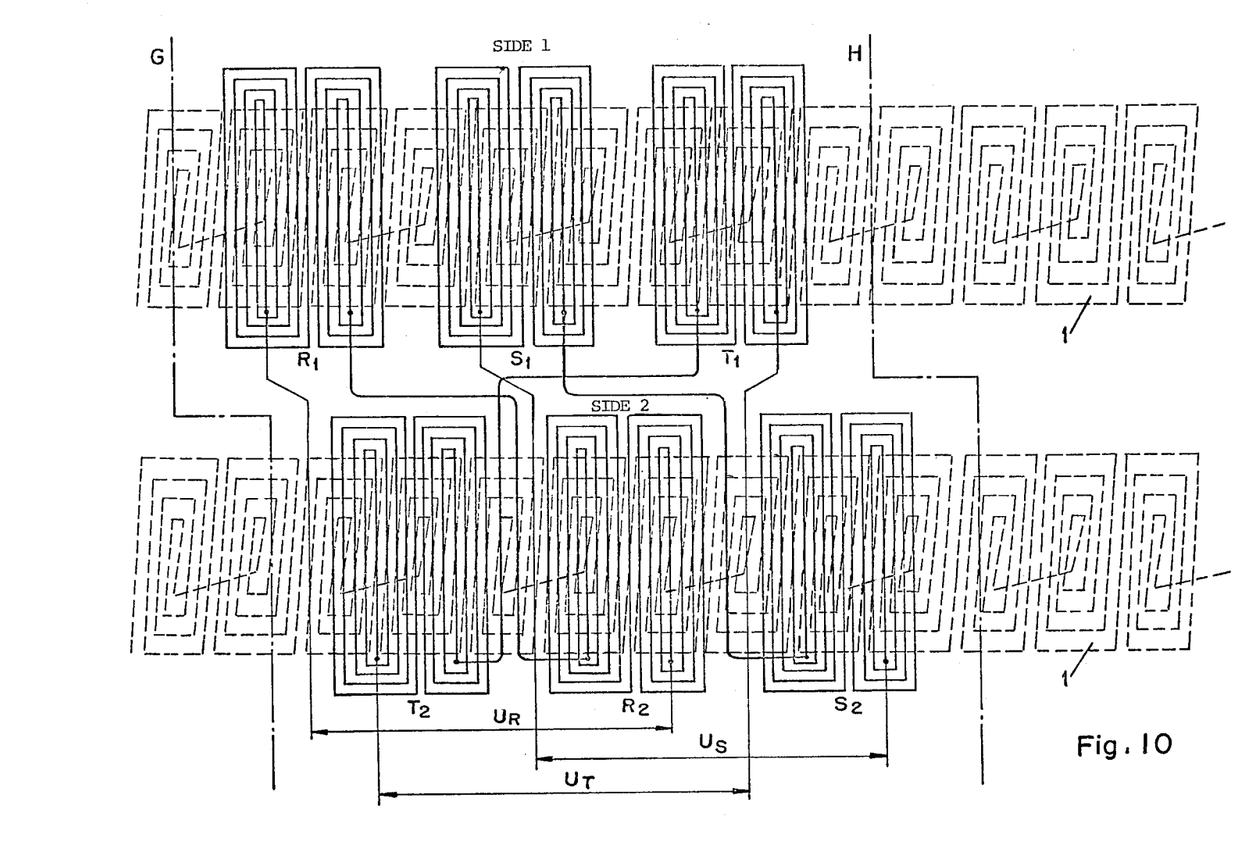
FIGS. 10 and 11 illustrate two embodiments of windings for a synchro.

FIG. 10 illustrates the manner in which the sensing windings can be positioned in relation to a primary winding when the position indicating device or angle-measuring device comprises a synchro. The synchro includes three sensing windings, $R_1$, $S_1$, $T_1$ which are mutually displaced through 120° on side 1 of the primary winding and sensing windings $R_2$, $S_2$, $T_2$ on side 2, the windings being arranged in a manner analogous to the windings of FIGS. 1 and 3. Moreover, similar to the embodiments of FIGS. 1 and 3, the winding 1 of FIG. 10 is the same for side 1 and side 2. Two dash-dot lines G and H are provided in FIG. 12 which are intended to indicate that the sensing windings can be repeated on the outer side of these lines or, in an embodiment wherein the pattern for the sensing windings is mounted on a cylinder, so that the lines G and H coincide. This pattern can also be applied in a ring or annulus disposed on planar plates in a manner analogous to that described in conjunction with FIGS 5 to 9. As will be seen from FIG. 10, the pattern in this embodiment must thus be repeated cyclically 3 n times for each revolution, where n is the number of times the pattern is repeated between G and H.

Figure 11:
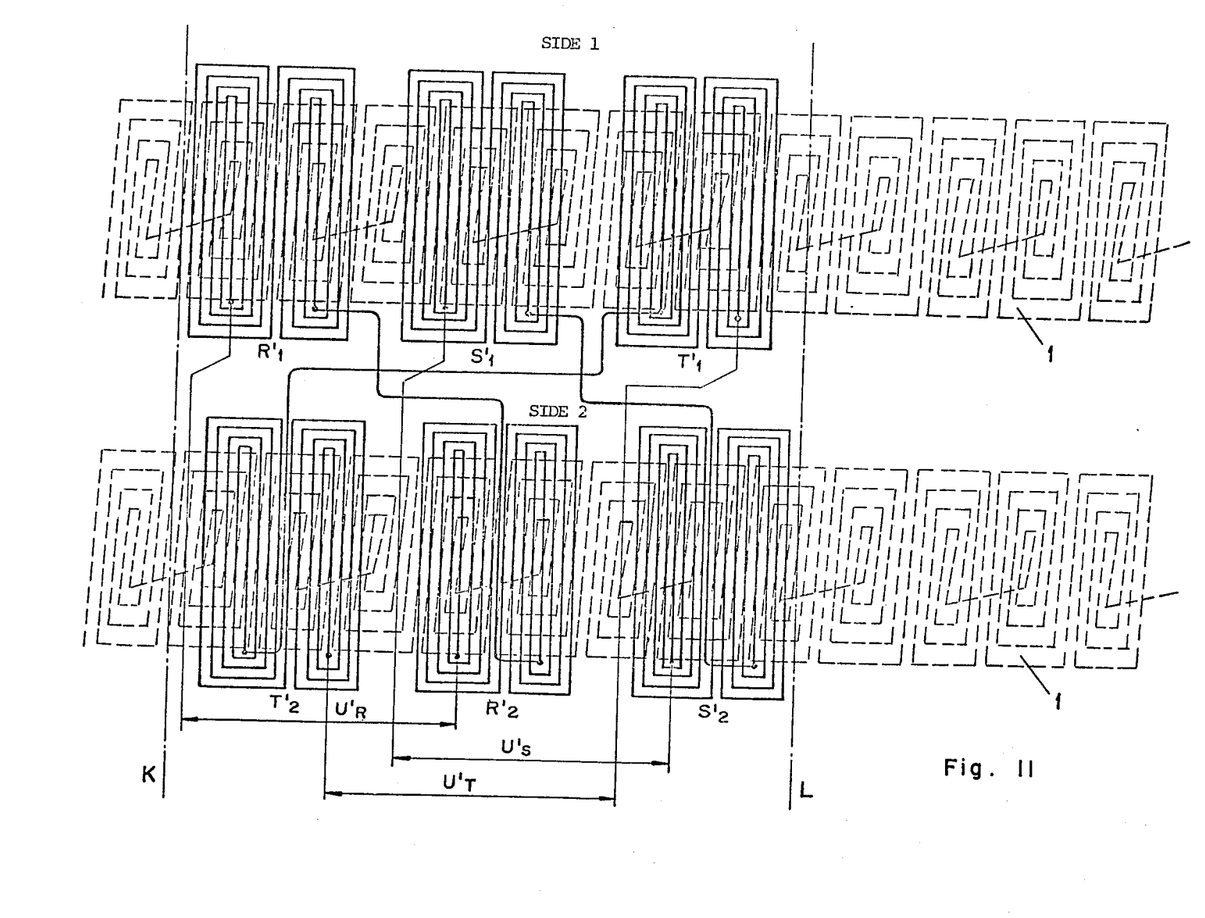

FIG. 11 illustrates a further pattern of primary and sensing windings for a synchro, which is similar to that of FIG. 10 and in which corresponding sensing winding have been given the same reference legends with primes attached. In the embodiment of FIG. 11, on side 2 of primary winding 1, the right hand pattern division for each sensing winding part has been moved to the left of the left-hand side pattern division as compared with FIG. 10. In this way, both the primary winding pattern 1 and the pattern of the sensing windings $R'_1$, $S'_1$, $T'_1$ and $R'_2$, $S'_2$, $T'_2$ on both sides of the primary winding 1 can be repeated with respect to vertical lines having the same position K and L, which is an advantage in adapting the patterns during manufacture.

Figure 12:
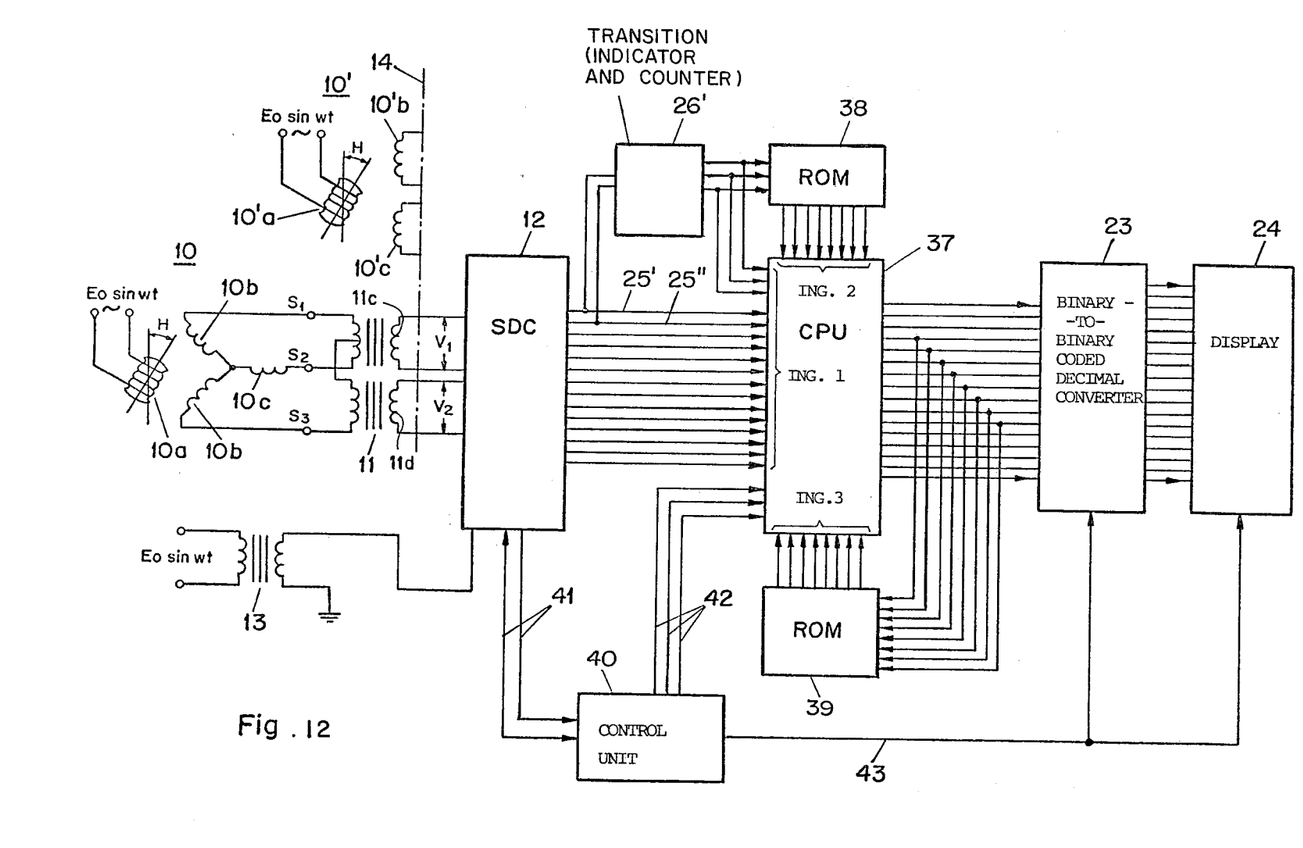
FIG. 12 illustrates an embodiment of a circuit for connection to sensing windings so as to process a measurement signal.

Referring to FIG. 12, a block schematic diagram is provided of a processing and indicating apparatus adapted to be coupled to the sensing windings of a position—measuring device. The position—measuring device may, for example, be an angle-measuring device of the synchro type, indicated at 10 or of the resolver type, indicated at 10'. The apparatus of FIG. 12 presents the measured position in digital form.

In FIG. 12, a sinusoidal alternating voltage $E_o \sin wt$, is applied to the primary winding 10a of the synchro 10 which includes three secondary windings 10b, 10c, and 10d arranged at 120° relative to each other. Secondary windings 10b, 10c and 10d are coupled in known manner to three inputs on the three-phase side of a Scott-transformer 11 which converts the incoming three-phase signal to a two-phase signal available at the two secondary windings 11c and 11d of transformer 11. The two-phase windings 11c and 11d are each coupled to a respective input of a synchro-to-digital converter (SDC) 12, which presents at the output thereof a digital value representing the measured value of angle. Synchro to digital converters of this type are conventional and in a standard design take the form of integrated circuits having approximately 10 to 16 output lines. The operation of these converters is such that, when indicating zero degrees, all output lines produce a "0" -signal and, when indicating 360° -Δ (where Δ represents a very small number), all the output lines have a "1" -signal. As indicated by the chain line 14 in FIG. 2, a position or angle indicator of the resolver type having two sensing windings mutually phased displaced by 90° can be coupled directly to the analog inputs of synchro-to-digital converter 12. The resolver, which is indicated at 10', includes a primary winding 10'a and orthogonal secondary windings 10b', 10c'. In addition, a reference input of converter 12 is coupled to the secondary winding of a reference transformer 13 whose primary winding is supplied with a sinusoidal alternating voltage of the same frequency and phase as that which is supplied to the primary winding 10a (or 10a').

As mentioned above, converter 12 presents a digital value representing angular position H on a plurality of parallel output lines. Normally, between 10 and 16 output lines are provided and in the case of 16 outputs, a resolution of approximately ±1 minute of arc is obtained.

Output lines 25' and 25" of converter 12 carry the most significant binary bits from synchro to digital converter (SCD) 12 and are connected to a transition indicator or indicator and counter 26 and to a central processing unit (CPU) 37. In the case of a multi-pole synchro or a multi-pole resolver, the output from SDC 12 cyclically varies between a set of values a number of times corresponding to the number of poles, with each cycle corresponding to rotation by the synchro or resolver of through an angle of 360°/P where P is the number of poles. In order that a synchro or resolver of this type can be used to measure angles over a complete revolution, the number of cycles must be indicated and counted. This is effected in indicator and counter 26, which, when the signals on the lines 25', 25" change from binary "11" to binary "00", adds 1 to a stored count and, when the signal on lines 25', 25" changes from binary "00" to binary "11", substracts 1 from the count. In exemplary embodiments wherein the synchro/resolver has 8-poles, indicator and counter 26 includes three lines. The output of indicator and counter 26 is connected to supply the stored count to the address input of a read-only memory (ROM) 38 which thus produces at the output thereof a correction quantity which is particular to the relevant sector of the angular mechanical portion of the synchro or resolver.

The output of indicator and counter 26 is also connected to the three most significant bit input lines of a first group of input lines, denoted ING 1., of central data processing unit (CPU) 37. Lines ING. 1 will hereinafter be referred to by number starting from the top in FIG. 12, these lines being thus numbered 1 to 17 beginning at the top. The output of the converter 12 is connected directly to the input lines 4 to 17 of input lines ING. 1. The output of read-only memory 38 is connected to a second multi-line input group, denoted Ing. 2, of CPU 37. The output lines of CPU 37 having the most significant bits within a arc of rotation are connected to the address input of a read-only memory (ROM) 39. In the illustrated embodiment of FIG. 14, the lines from the fourth from the top to the eleventh from the top provide the most significant bits as shown. ROM 39 stores correction quantities for positions within a part revolution, i.e., an arc of rotation. The output of the memory 39 is coupled to a third multi-line input of CPU 37, denoted ING. 3. In addition, there is provided a control unit 40 which, over lines 41, controls, or is controlled by, the converter 12 in the following manner. The quantity which is present on the output lines of converter 12 at any moment is retained on the output lines for that period of time for which a control signal from the control unit 40 remains on line 41. In turn, the converter 12 can indicate to the control unit 40, over line 41, whether the display provided by unit 24 should be delayed to allow time for resolver 10' or synchro 10 to be rotated and the output quantity from converter 12 to be changed. Control unit 40 is connected through 42 to the control input of CPU 37 in order to cause the central data processing unit 37 to effect or carry out the following operational steps:

1. Feed the data on the first group of input lines ING. 1 to the output lines.

2. Store the information on the third group of input lines ING. 3 from the read-only memory 39 in a buffer memory (not shown) incorporated in CPU 37.

3. Add one to the number on the input lines ING. 1, which number corresponds to those output lines of CPU 37 that are connected to the address input of read-only memory 39.

4. Make an interpolation between the correction quantity stored in step 2 above and the new correction quantity present on lines ING. 3 from the read-only memory 39, the interpolation being carried out in accordance with the number represented by the values on the lines of the group of lines ING. 1 which carry data less significant than that carried by those lines corresponding to the output lines coupled to the address input of the read-only memory 39.

5. Add the correct value obtained under step 4 above to the correction number on lines ING. 2 from read-only memory 38 and to the number of lines ING. 1 and present the number thus obtained at the output of CPU 37.

The output of CPU 37 is connected to the input of a converter 23 which converts the binary data to binary coded decimal data (BCD). A display unit 24 is connected to the output of converter 23. Both display unit 24 and converter 23 are controlled by signals from control unit 40 after the signals to the control inputs of CPU 3, have been provided so that the number presented on the output of CPU 37, in accordance with step 5 above, is displayed by unit 24.

Many modifications are possible with the scope of the invention. For example, the outer sides of the stator plates illustrated in FIGS. 1, 3, 5, 10 and 11 may be provided with sensing windings. Thus, although the invention has been described relative to exemplary embodiments, it will be appreciated by those skilled in the art that other variations and modifications may be effected in these exemplary embodiments without departing from the scope and spirit of the invention.

I claim:

1. Electromechanical apparatus comprising first and second relatively rotatable parts, said first part including two oppositely facing parallel surfaces and said second part including two parallel surfaces each of which extends parallel to, and lies closely adjacent to, a respective one of said two surfaces of the first part, at least one said surface of the first part having secured thereto a first coil and the said two surfaces of the second part each having secured thereto at least one further coil and means for mounting said first and second parts for relative rotational movement so as to cause said further coils secured to the two surfaces of said second part to move along a predetermined path relative to said first coil, the inductive coupling between each said further coil and said first coil being dependent on the relative rotational position of said parts and said coils providing more than one electrical cycle per complete mechanical rotation of said relatively rotatable parts, an alternating current voltage being supplied to said first coil and coupled to said further coils, said apparatus further comprising electronic processing means for producing an output representative of said relative rotational position, said processing means being connected to said further coils and comprising electronic storage means having a plurality of storage locations which are individually addressable in response to addressing signals, means for deriving said addressing signals including counter means for counting said electrical cycles so as to identify the relevant sector of the mechanical rotation of said relatively rotatable parts, the said addressing signals being supplied to an address input of said storage means and said storage means further acting to store correction signals corresponding to respective measured values representative or angular positions in the relevant sectors of said mechanical rotation, and correction means for receiving said correction signals from said storage means and for correcting said measured values in accordance with said correction signals, said correction means providing a said output representing each measured value thus corrected.

2. Electromechanical apparatus comprising first and second relatively rotatable parts, said first part comprising a cylinder including two oppositely facing cylindrical surfaces each of which is equispaced from, and lies closely adjacent to, a respective one of said two cylindrical surfaces of the first part, at least one said surface of the first part having secured thereto a first coil and the said two surfaces of the second part each having secured thereto at least one further coil, and means for mounting said first and second parts for relative rotational movement so as to cause said further coils secured to the two surfaces of said second part to move along a predetermined path relative to said first coil, the inductive coupling between each said further coil and said first coil being dependent on the relative position of said parts and said coils providing at least two electrical cycles per complete mechanical rotation of said relatively rotatable parts, an alternating current voltage being supplied to said first coil and said apparatus further comprising electronic processing means for producing an output representative of said relative position, said processing means being connected to said further coils and comprising electronic storage means having a plurality of storage locations which are individually addressable in response to addressing signals, means for deriving said addressing signals including counter means for counting said number of electrical cycles so as to identify the relevant sector and the mechanical rotation of said relatively rotatable parts the said addressing signals being supplied to an address input of said storage means and said storage means storing correction signals corresponding to respective measured values representative of angular positions in said relevant sectors of said mechanical rotation and correction means for receiving said correction signals from said storage means and for correcting said measured values in accordance with said correction signals, said correction means providing a said output representing each measured value thus corrected.

3. Apparatus according to claim 2 wherein said first coil comprises a primary winding comprising at least one pair of oppositely spiralled coils.

4. Apparatus according to claim 3 wherein said at least one further coil comprises a secondary winding and there is equiangular spacing between each of the radially extending portions of said secondary winding.

5. Apparatus according to claim 4 wherein the shortest radially extending portion of said secondary winding is longer than the longest radially extending portion of said primary winding.

6. Apparatus according to claim 2 wherein said first coil comprises a primary winding and said further coils each comprise a secondary winding, the primary winding being laid out in a geometric pattern wherein the magnetic coupling between the primary winding and the secondary windings varies sinusoidually, the primary winding forming a rectangular spiral and the lengths of the radially extending portions of the primary winding varying in a predetermined non-constant relationship.

7. Apparatus according to claim 2 wherein said first coil comprises first and second primary windings disposed on said opposite cylindrical facing surfaces of said first part and angularly displaced from one another such that a radially extending portion of the first primary winding lies in the middle of a pair of the radially extending portions of the second primary winding.

8. Apparatus according to claim 1 wherein said first coil comprises a primary coil and each said further coil comprises a secondary coil, said apparatus further comprising means for connecting said secondary coils in series.

9. Apparatus according to claim 1 wherein said first coil comprises a first secondary coil, said apparatus further comprising a second secondary coil and said first and second secondary coils being respectively secured to the oppositely facing surfaces of said first part.

10. Apparatus according to claim 2 wherein said coils comprise rectangular spirals which are shaped to conform to said cylindrical surfaces.

11. Apparatus according to claim 1 wherein each of said surfaces is substantially flat and the individual turns of each said coil lie substantially within a respective single plane parallel to said surfaces.

12. Apparatus according to claim 1 wherein the individual turns of each further coil are uniformly mutually spaced.

13. Apparatus according to claim 1 wherein said parts are mutually positioned such that when said first coil is energized the density of magnetic flux is substantially uniform over each surface carrying a said further coil.

14. Apparatus according to claim 1 wherein each said coil comprises a conductor pattern constituted by an electrically conductive layer secured to the relevant said surface.

15. Apparatus according to claim 14 wherein each conductive layer comprises a printed circuit.

16. Apparatus according to claim 8 wherein one of said parts comprises a generally plate-like member said apparatus further comprising means for mounting said parts for relative rotation about a common axis, and the primary coil being generally annular and having a center which is coincident with said axis.

17. Apparatus according to claim 1 wherein each of the coils has the form of at leaast one rectangular spiral having two opposite parallel sides parallel to said predetermined path.

18. Apparatus according to claim 17 wherein those conductors of the first coil that form the at least one rectangular spiral and extend transversely to said path are inclined at an acute angle relative to the corresponding conductors of each further coil, the transverse conductors of each further coil being substantially perpendicular to said path, and said acute angle being such that the distance, in the direction of said path, between the ends of each of the transverse conductors of the first coil is greater than the conductor spacing of the transverse conductors in the other coils.

19. Apparatus according to claim 17 wherein those conductors of the first coil that form the at least one rectangular spiral and extend transversely to said path are inclined at an acute angle relative to the corresponding conductors of each further coil, the transverse conductors of said first coil being substantially perpendicular to said path, and said acute angle being such that the distance, in the direction of the path, between the ends of each of the transverse conductors of each of further coil is greater than the spacing of the transverse conductors of the first coil.

20. Apparatus according to claim 18 wherein each further coil is such that its shortest conductor extending transversely of said path is longer than the longest conductor extending transversely of the said path in said first coil.

21. Apparatus according to claim 19 wherein each secondary coil is such that its shortest conductor extending transversely of said path is longer than the longest conductor extending transversely of said path in said first coil.

22. Apparatus according to claim 8 wherein said first coil has a cyclically repeated winding pattern.

23. Apparatus according to claim 22 wherein each secondary coil comprises a plurality of coil parts, the secondary coils being substantially identical, and each coil part being wound in the same manner as the primary coil at least over one half cycle thereof.

24. Apparatus according to claim 22 wherein said secondary windings comprise coil parts which are each wound in the same manner as the primary coil over a whole cycle thereof.

25. Apparatus according to claim 23 wherein said plurality of coil parts includes first and second coil parts and said apparatus further comprises means for mounting said first and second coil parts for rotation relative to one another and two secondary coils mutually offset by 90° from one another.

26. Apparatus according to claim 23 wherein said plurality of coil parts includes first and second coil parts, and said apparatus further comprises means for mounting said first and second coil parts for rotation relative to one another and three said further coils mutually offset by 120° from one another.

27. Apparatus according to claim 1 wherein said storage means comprises a non-volatile memory.

28. Apparatus according to claim 1 wherein said storage means comprises a read-only memory.

* * * * *